United States Patent
Yang

(10) Patent No.: US 6,774,499 B1
(45) Date of Patent: Aug. 10, 2004

(54) NON-LEADED SEMICONDUCTOR PACKAGE AND METHOD OF FABRICATING THE SAME

(75) Inventor: Ke-Chuan Yang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/437,562

(22) Filed: May 13, 2003

(30) Foreign Application Priority Data

Apr. 2, 2003 (TW) ........................ 92107461 A

(51) Int. Cl.$^7$ .............................................. H01L 23/48
(52) U.S. Cl. ...................... 257/786; 257/736; 257/739; 257/749; 257/773; 257/777; 257/787
(58) Field of Search ............................ 257/786, 787, 257/736, 739, 749, 773, 777

(56) References Cited

U.S. PATENT DOCUMENTS

| | | | | |
|---|---|---|---|---|
| 3,809,625 A | * | 5/1974 | Brown et al. ................ | 205/103 |
| 4,899,667 A | * | 2/1990 | Miller et al. .................. | 108/47 |
| 5,830,800 A | | 11/1998 | Lin .............................. | 438/459 |
| 6,054,773 A | * | 4/2000 | Ohsawa et al. .............. | 257/783 |
| 6,153,448 A | * | 11/2000 | Takahashi et al. ........... | 438/114 |
| 6,320,250 B1 | * | 11/2001 | Takahashi ..................... | 257/678 |
| 6,333,565 B1 | * | 12/2001 | Hashimoto ................... | 257/781 |
| 6,396,157 B2 | * | 5/2002 | Nakanishi et al. ........... | 257/781 |
| 6,515,372 B1 | * | 2/2003 | Narizuka et al. ............. | 257/779 |
| 6,570,251 B1 | * | 5/2003 | Akram et al. ................ | 257/738 |
| 6,577,008 B2 | * | 6/2003 | Lam et al. .................... | 257/750 |
| 6,590,295 B1 | * | 7/2003 | Liao et al. .................... | 257/781 |
| 6,597,069 B1 | * | 7/2003 | Degani et al. ............... | 257/778 |

FOREIGN PATENT DOCUMENTS

| JP | 61-292947 | * | 12/1986 | ................. 257/781 |
|---|---|---|---|---|
| JP | 63-283044 | * | 11/1988 | ................. 257/781 |

* cited by examiner

Primary Examiner—Jasmine Clark
(74) Attorney, Agent, or Firm—Peter F. Corless; Steven M. Jensen; Edwards & Angell, LLP

(57) ABSTRACT

A non-leaded semiconductor package and method of fabricating the same is proposed, which can be used for the fabrication of a non-leaded type of semiconductor package, such as a CQFN (Carrierless Quad Flat No-lead) package. The proposed semiconductor packaging technology is characterized by the use of a metal plate as provisional chip carrier during fabrication and by the use of RDL (Redistribution Layer) technology to provide internal electrical interconnections between the I/O pads of the packaged chip and the non-leaded external electrical contacts. These features allow the fabrication of the CQFN package to be implemented without the use of bonding wires for internal electrical connections and without the use of substrate as a permanent chip carrier.

18 Claims, 5 Drawing Sheets

NON-LEADED SEMICONDUCTOR PACKAGE AND METHOD OF FABRICATING THE SAME

BACKGROUND OF THE INVENTION

1. Field of the Invention

This invention relates to semiconductor packaging technology, and more particularly, to a non-leaded semiconductor package and method of fabricating the same, which can be used for the fabrication of a non-leaded type of semiconductor package, such as a CQFN (Carrierless Quad Flat No-lead) package.

2. Description of Related Art

U.S. Pat. No. 5,830,800 "PACKAGING METHOD FOR A BALL GRID ARRAY INTEGRATED CIRCUIT WITHOUT UTILIZING A BASE PLATE" discloses an advanced type of semiconductor packaging technology called CQFN (Carrierless Quad Flat No-lead), which is used in the semiconductor industry for the fabrication of small size semiconductor packages. FIG. 4 is a schematic diagram showing the structure of a CQFN package. As shown, this CQFN package is characterized by the provision of non-leaded external connecting pads 20 on the bottom surface of the encapsulation body for external electrical connection with a printed circuit board. Since these pads are non-protruding beyond the encapsulation body, the resulted package 10 appears to be non-leaded and therefore is considerably made more compact in size than leaded-type of semiconductor packages.

In the foregoing CQFN package, the internal packaged chip is typically electrically connected to the non-leaded external connecting pads by means of bonding wires 12. Moreover, conventional CQFN package structures are typically constructed on a metal plate, i.e., the packaged chip 30 is mounted on the front side of a metal plate while the non-leaded external connecting pads are arranged at the front side of the metal plate. However, as the semiconductor fabrication technology has advanced to the next level of downsizing, such as below 0.5 mm, it becomes highly difficult to use the wire bonding technology for internal interconnecting of the packaged chip 30 with the non-leaded external connecting pads in the CQFN package due to the restriction in wire loop height. Moreover, it also becomes highly difficult and costly to fabricate a smaller metal plate for the CQFN package. Therefore, in view of the foregoing problems of prior art, there exists a need in the semiconductor industry for a new semiconductor packaging technology that can be used for the fabrication of a CQFN semiconductor package without the use of wire bonding technology for the fabrication of the CQFN packages.

SUMMARY OF THE INVENTION

It is therefore an objective of this invention to provide a non-leaded semiconductor packaging technology which can be used for the fabrication of a CQFN semiconductor package without the use of bonding wires for internal electrical connections.

The proposed semiconductor packaging technology is characterized by the use of a plate as provisional chip carrier during fabrication and by the use of RDL (Redistribution Layer) technology to provide internal electrical interconnections between the I/O pads of the packaged chip and the non-leaded external electrical contacts. These features allow the fabrication of the CQFN package to be implemented without the use of bonding wires for internal electrical connections and without the use of substrate as a permanent chip carrier.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The non-leaded semiconductor packaging technology according to the invention is disclosed in full details by way of preferred embodiments in the following with reference to the accompanying drawings. In the following preferred embodiments, for example, the invention is used for the fabrication of a CQFN (Carrierless Quad Flat No-lead) semiconductor package. Note that all of the drawings in this specification are simplified schematic diagrams to show only those parts related to the invention; and the shown parts are not drawn to actual scale, size, and number, which can be arbitrary design choices in the actual implementation of the invention.

First Preferred Embodiment (FIGS. 1A–1G)

Figure 1A:
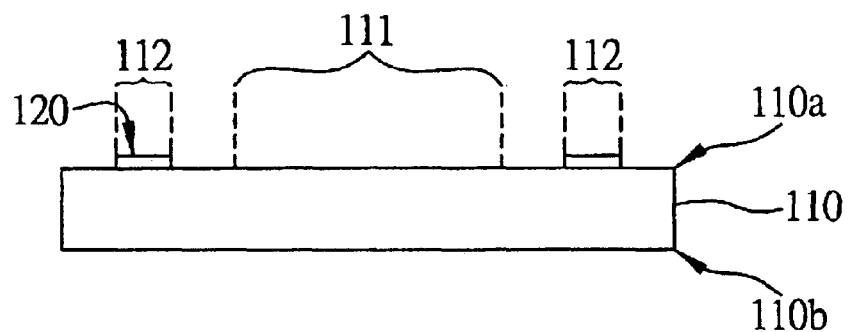
FIGS. 1A–1G are schematic diagrams used to depict the procedural steps involved in a first preferred embodiment of the method according to the invention for fabricating a CQFN package.
Figure 1B:
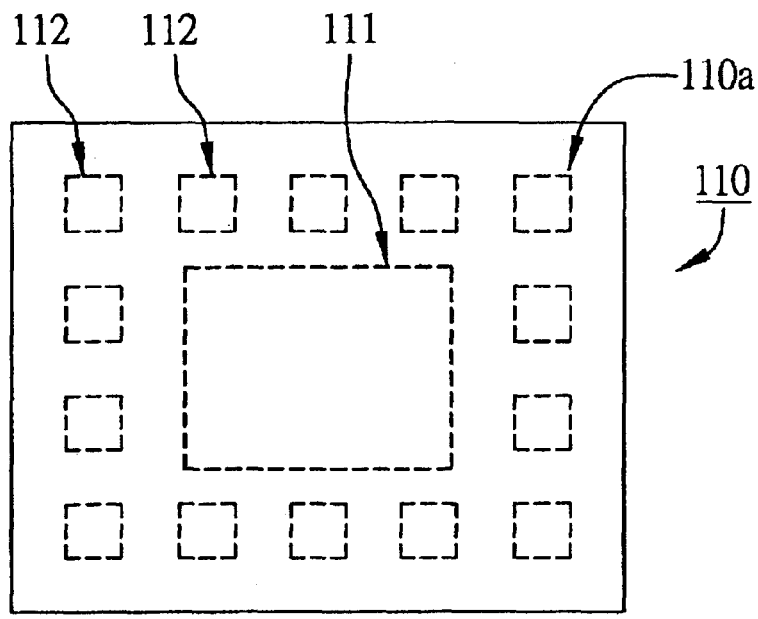

Referring first to FIG. 1A, in the fabrication process according to the first preferred embodiment of the method of the invention, the initial step is to prepare a provisional chip carrier 110, which can be made of copper (Cu) or aluminum (Al), and which has a front surface 110a and a back surface 110b opposite to the front surface 110a, and whose front surface 110a is predefined by design into a die-attachment region 111 and a plurality of non-leaded external-connecting regions 112 surrounding the die-attachment region 111. FIG. 1B is a top view showing the front surface 110a of the provisional chip carrier 110 where the die-attachment region 111 and the non-leaded external-connecting regions 112 are defined.

Next, a plurality of bonding pads 120 are formed over the non-leaded external-connecting regions 112 of the provisional chip carrier 110. These bonding pads 120 can be formed, for example, from solder, or palladium, or gold.

Figure 1C:
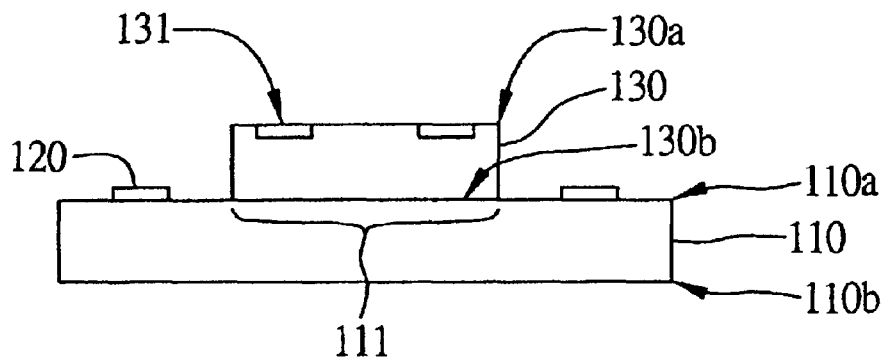
Figure 1D:
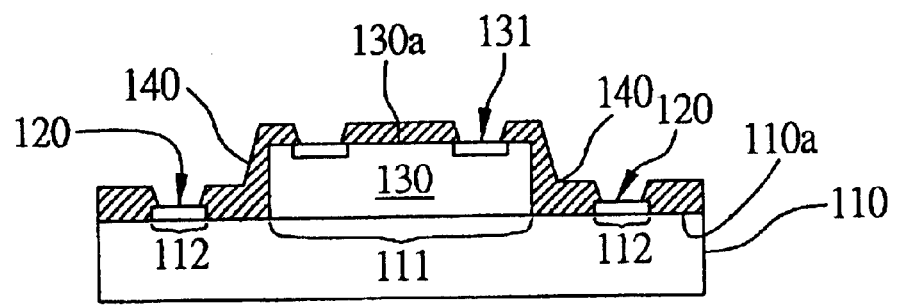

Referring next to FIG. 1C, in the subsequent step, a semiconductor chip 130 having a plurality of I/O pads 131 is attached to the die-attachment region 111 of the provisional chip carrier 110 with the I/O pads 131 facing upwards. The chip 130 has a front side 130a and a back side 130b, and where the I/O pads 131 are arranged on the front side 130a thereof Referring further to FIG. 1D, in the next step, an electrically-insulative layer 140 is formed to cover the entire front surface 110a of the provisional chip carrier 110 and the chip 130 while exposing the bonding pads 120 on the non-leaded external-connecting regions 112 and the I/O pads 131 on the chip 130. This electrically-insulative layer 140 can be formed by, for example, first performing a coating process to coat an electrically-insulative material such as polyimide (PI) or benzocyclobutene (BCB) over the entire semi-finished package structure, and then performing a selective-removal process (i.e., pattern definition) by using photolithography to expose the bonding pads 120 on the non-leaded external-connecting regions 112 and the I/O pads 131 on the chip 130. Since the coating process and photolithography are all conventional technologies, description thereof will not be detailed in this specification.

Figure 1E:
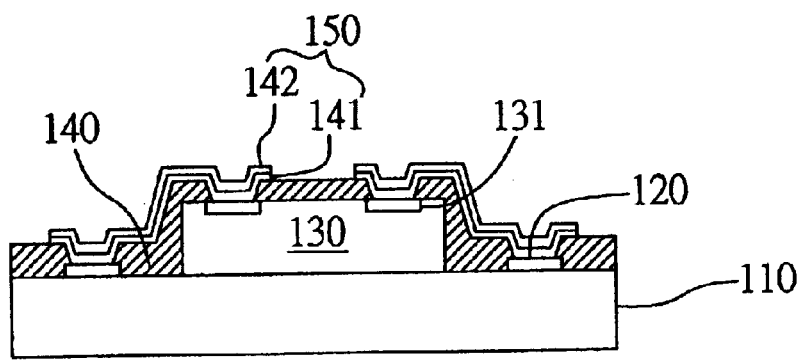

Referring further to FIG. 1E, in the next step, an RDL (Redistribution Layer) process is performed to fabricate a plurality of redistribution layers 150 over the electrically-insulative layer 140 from an electrically-conductive material, such as copper (Cu), with each of the redistribution layers 150 interconnecting one of the I/O pads 131 on the chip 130 to a corresponding one of the bonding pads 120 on the non-leaded external-connecting regions 112 on the provisional chip carrier 110. These redistribution layers 150 can be formed, for example, by first performing a first metal-deposition process to deposit a first electrically-conductive material 141, such as copper (Cu), over the entire top surface of the semi-finished package structure through a sputtering process or an electroless-plating process; and then performing a second metal-deposition process to deposit a second electrically-conductive material 142 over the first electrically-conductive material 141 through an electroplating process; and finally performing a selective-removed process (i.e., pattern definition) by photolithography to remove selected portions of the combined structure of the first electrically-conductive material 141 and the second electrically-conductive material 142. Since the sputtering, electroless-plating, and photolithography utilized here are all conventional technologies, description thereof will not be detailed in this specification.

In addition, a heat spreader (HS) can be attached to the chip 130 to provide a heat dissipation path for the chip 130. However, since the heat spreader is an optional component to the CQFN package, details thereof will not be described.

Figure 1F:
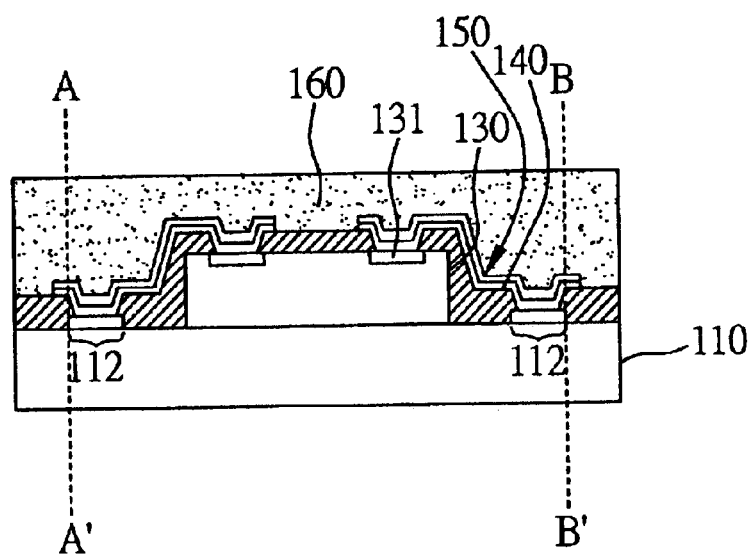
Figure 1G:
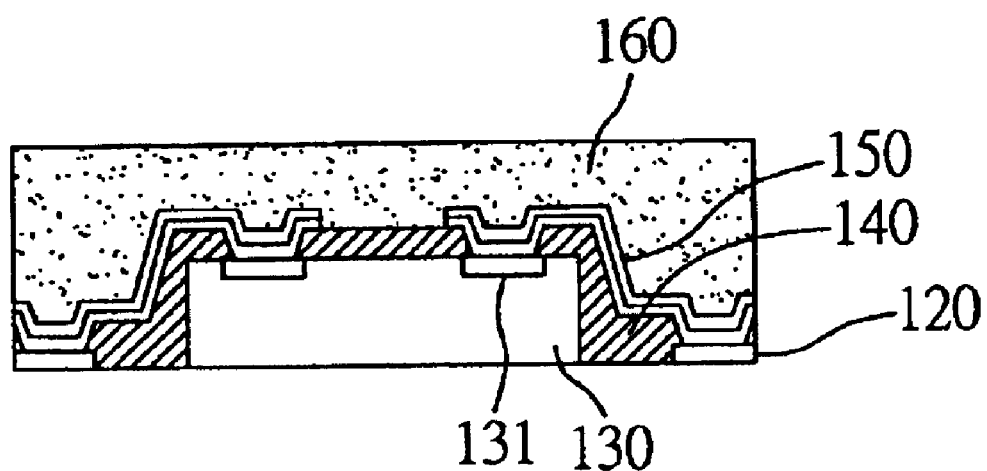

Referring next to FIG. 1F, in the subsequent step an encapsulation body 160 is formed over the entire semi-finished package structure to cover all of the redistribution layers 150. After this, a singulation process is performed to cut lengthwise along the singulation lines A–A' and B–B' shown in FIG. 1F, i.e., along the outer border of the predefined non-leaded external-connecting regions 112 on the provisional chip carrier 110, and meanwhile the entire provisional chip carrier 110 is stripped away, whereby a single unit of CQFN package is produced, as illustrated in FIG. 1G. This CQFN package can be electrically connected to an external printed circuit board (not shown) through the bonding pads 120 which are fashioned into non-protruding and flatly-shaped to serve as external electrical contacts.

Figure 2A:
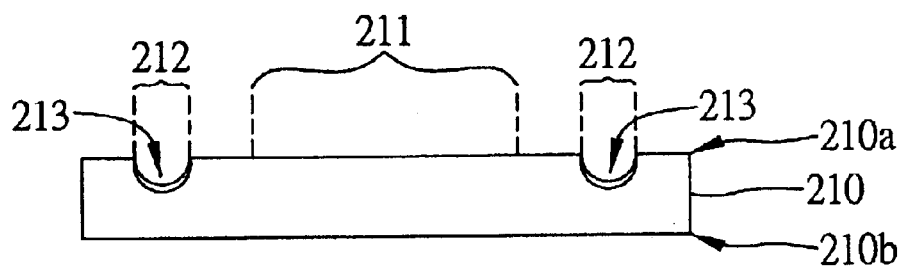
FIGS. 2A–2C are schematic sectional diagrams used to depict the procedural steps involved in a second preferred embodiment of the method according to the invention for fabricating a CQFN package.
Figure 2B:
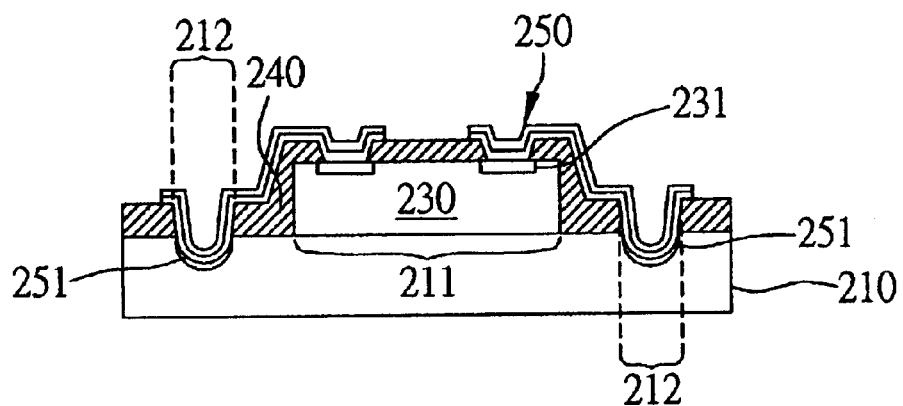
Figure 2C:
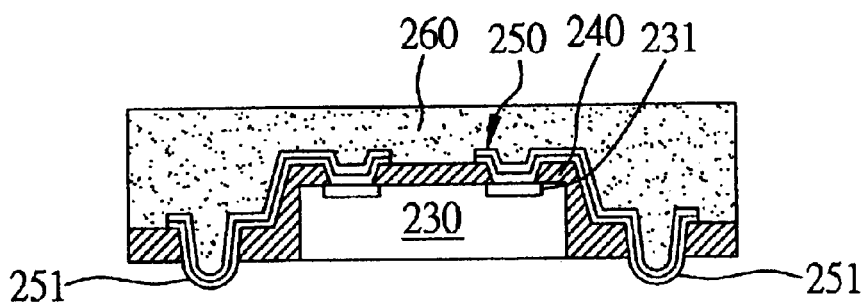

Second Preferred Embodiment (FIGS. 2A–2C)

FIGS. 2A–2C are schematic sectional diagrams used to depict a second preferred embodiment of the method according to the invention for fabricating a CQFN package.

Referring first to FIG. 2A, in the fabrication process according to the second preferred embodiment of the method of the invention, the initial step is to prepare a provisional chip carrier 210 having a front surface 210a and a back surface 210b opposite to the front surface 210a, and whose front surface 210a is predefined by design into a die-attachment region 211 and a plurality of non-leaded external-connecting regions 212 surrounding the die-attachment region 211.

The second preferred embodiment differs from the previous one particularly in that the non-leaded external-connecting regions 212 are formed with recessed bonding pads 213 made of solder, or palladium, or gold.

Referring next to FIG. 2B, the subsequent steps include the attachment of a chip 230 over the die-attachment region 211, the fabrication of an electrically-insulative layer 240, and the fabrication of a plurality of redistribution layers 250. Since these steps are all performed in the same manners as the first preferred embodiment, detailed description of thereof will not be repeated here.

Referring to FIG. 2C, in the subsequent step an encapsulation body 260 is formed over the entire semi-finished package structure to cover all of the redistribution layers 250. After this, a singulation process is performed and the entire provisional chip carrier 210 is stripped away, whereby a single unit of CQFN package is produced, as illustrated in FIG. 2C. This CQFN package can be electrically connected to an external printed circuit board (not shown) by means of the downward-protruding contact points 251 which are fashioned into downwardly-protruding and bump-like shaped to serve as external electrical contacts. Solder (not shown) can be plated to these downward-protruding contact points 251 to bond the CQFN package to an external printed circuit board (not shown).

Figure 3:
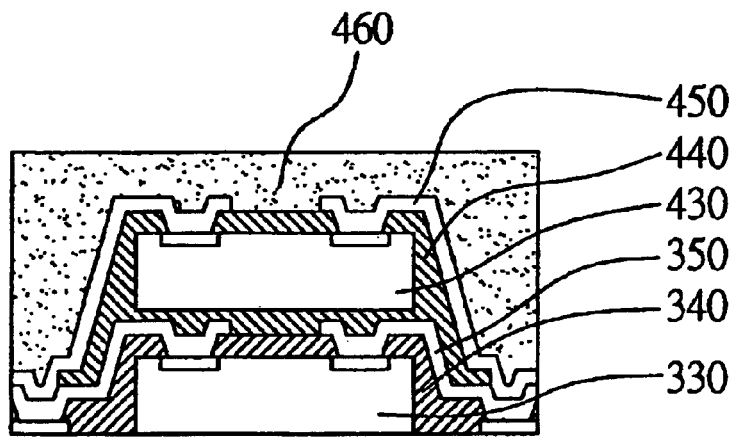
FIG. 3 is a schematic sectional diagram used to depict a third preferred embodiment of the semiconductor package according to the invention.
Figure 4:
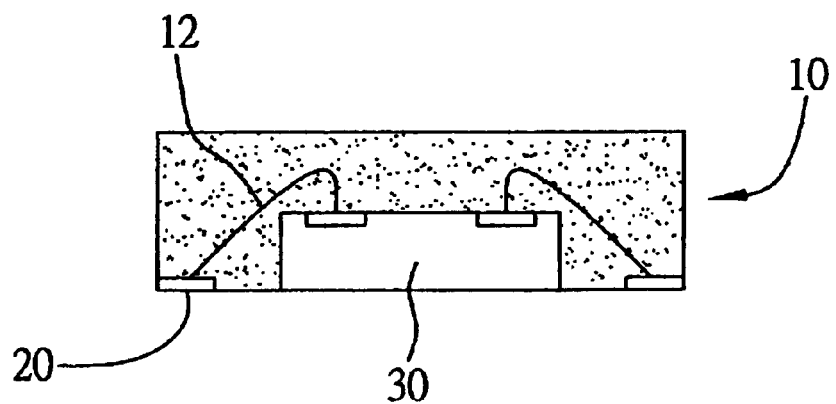
FIG. 4 is a schematic diagram showing the structure of a conventional CQFN package.

Third Preferred Embodiment (FIG. 3)

FIG. 3 is a schematic sectional diagram used to depict a third preferred embodiment of the semiconductor package according to the invention.

As shown, the semiconductor packaging technology according to the invention can also be used to fabricate a stacked type of CQFN package, which includes an underlying chip 330 and an overlying chip 430 stacked over the underlying chip 330. The underlying chip 330 and its associated electrically-insulative layer 340 and redistribution layers 350 are formed in accordance with the procedural steps described in the first preferred embodiment, and after this, the same procedural steps can be repeated once to mount the overlying chip 430 and its associated electrically-insulative layer 440 and redistribution layers 450.

Conclusion

In conclusion, the invention provides a new semiconductor packaging technology which is used for the fabrication of a semiconductor package, such as a CQFN (Carrierless Quad Flat No-lead) type of semiconductor package, and which is characterized by the use of a provisional chip carrier as provisional chip carrier during fabrication and by the use of RDL (Redistribution Layer) technology to provide internal electrical interconnections between the I/O pads of the packaged chip and the non-leaded external electrical contacts. These features allow the fabrication of the CQFN package to be implemented without the use of bonding wires for internal electrical connections and therefore the invention is suitable for the fabrication of downsized CQFN packages.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a non-leaded semiconductor package, comprising the steps of:

(1) preparing a provisional chip carrier having a front surface and a back surface and whose front surface is predefined into a die-attachment region and a plurality of non-leaded external-connecting regions surrounding the die-attachment region;

(2) attaching a chip over the die-attachment region of the provisional chip carrier, wherein the chip has a front surface and a back surface opposite to the front surface and whose front surface is formed with a plurality of I/O pads and whose back surface is attached to the die-attachment region on the provisional chip carrier;

(3) coating an electrically-insulative layer over the front surface of the provisional chip carrier and the front surface of the chip but exposing the non-leaded external-connecting regions on the provisional chip carrier as well as the I/O pads on the chip;

(4) forming a plurality of redistribution layers over the electrically-insulative layer, wherein each of the redistribution layers is laid at predefined locations for interconnecting one of the I/O pads on the chip to a corresponding one of the non-leaded external connecting regions;

(5) forming an encapsulation body over the electrically-insulative layer and the redistribution layers; and (6) stripping away the provisional chip carrier.

2. The method of claim 1, wherein in said step (1), the provisional chip carrier is made of a material selected from the group including copper and aluminum.

3. The method of claim 1, wherein in said step (1), the non-leaded external-connecting regions are formed with bonding pads prior to the fabrication of the electrically-insulative layer so as to allow the redistribution layers laid thereon in said step (4) to be fashioned into non-protruding and flatly-shaped external electrical contacts.

4. The method of claim 1, wherein in said step (1), the nor-leaded external-connecting regions are formed with recessed bonding pads.

5. The method of claim 1, wherein in said step (3), the electrically-insulative layer is formed through a process including the steps of:

performing a coating process to coat an electrically-insulative material over the front surface of the provisional chip carrier and the front surface of the chip; and performing a selective-removal process to remove those portions of the electrically-insulative material that are laid directly over the non-leaded external connecting regions on the provisional chip carrier and the I/O pads on the chip.

6. The method of claim 5, wherein the electrically-insulative material is polyimide (PI).

7. The method of claim 5, wherein the electrically-insulative material is benzocyclobutene (BCB).

8. The method of claim 1, wherein in said step (4), the redistribution layers are formed through a process including the steps of:

performing a first metal-position process to deposit a first electrically-conductive material over the electrically-insulative layer and over the exposed non-leaded external-connecting regions on the provisional chip carrier and the exposed I/O pads on the chip;

performing a second metal-deposition process to deposit a second electrically-conductive material over the first electrically-conductive material; and performing a selective-removal process to remove selected portions of the combined structure of the first electrically-conductive material and the second electrically-conductive material, with the remaining portions thereof serving as the redistribution layers.

9. The method of claim 8, wherein the first electrically-conductive material is copper.

10. The method of claim 8, wherein the second electrically-conductive material is copper.

11. The method of claim 8, wherein the first metal-position process is implemented through a sputtering process.

12. The method of claim 8, wherein the first metal-deposition process is implemented through an electroless plating process.

13. The method of claim 8, wherein the second metal-deposition process is implemented through an electroplating process.

14. A non-leaded semiconductor package, which comprises:

a chip having a front surface and a back s opposite to the front surface and whose front surface is formed with a plurality of I/O pads;

a plurality of external electrical contacts, which are arranged on a plane substantially leveled to the back surface of the chip;

an electrically-insulative layer, which covers the front surface of the chip but exposing the I/O pads on the chip;

a plurality of redistribution layers, which are formed over the electrically-insulative layer, with each of the redistribution layers interconnecting one of the I/O pads on the chip to a corresponding one of the external electrical contacts; and an encapsulation body, which is laid over the electrically-insulative layer and the redistribution layers.

15. The non-leaded semiconductor package of claim 14, wherein the external electrical contacts are non-protruding and flatly-shaped bonding pads.

16. The non-leaded semiconductor package of claim 14, wherein the external electrical contacts are downwardly-protruding and bump-like shaped and which are part of the redistribution layers.

17. The non-leaded semiconductor package of claim 14, wherein, the electrically-insulative layer is formed from polyimide (PI).

18. The non-leaded semiconductor package of claim 14, wherein the electrically-insulative layer is formed from benzocyclobutene (BCB).

* * * * *